United States Patent
Chang

(10) Patent No.: US 11,711,914 B2
(45) Date of Patent: Jul. 25, 2023

(54) SEMICONDUCTOR STRUCTURE HAVING BURIED GATE STRUCTURE AND METHOD OF MANUFACTURING THE SAME

(71) Applicant: Winbond Electronics Corp., Taichung (TW)

(72) Inventor: Feng-Jung Chang, Nantou County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 92 days.

(21) Appl. No.: 17/224,818

(22) Filed: Apr. 7, 2021

(65) Prior Publication Data

US 2022/0328491 A1 Oct. 13, 2022

(51) Int. Cl.
*H10B 12/00* (2023.01)

(52) U.S. Cl.
CPC ........... *H10B 12/34* (2023.02); *H10B 12/053* (2023.02)

(58) Field of Classification Search
CPC ........ H01L 27/10823; H01L 27/10876; H10B 12/053; H10B 12/34
USPC ...................................................... 257/330
See application file for complete search history.

(56) References Cited

U.S. PATENT DOCUMENTS

| 8,173,506 | B2 | 5/2012 | Jung |
| 9,064,956 | B2 | 6/2015 | Oh |
| 9,236,439 | B2 | 1/2016 | Jeong |
| 9,917,167 | B2 | 3/2018 | Jang |
| 2013/0043519 | A1 | 2/2013 | Moon |
| 2016/0056160 | A1 | 2/2016 | Jang et al. |
| 2016/0093710 | A1 | 3/2016 | Jeong |
| 2017/0125422 | A1* | 5/2017 | Kang ................ H01L 21/28105 |
| 2019/0157274 | A1 | 5/2019 | Chang et al. |

FOREIGN PATENT DOCUMENTS

| CN | 107527912 A | 12/2017 |
| TW | 201440173 A | 10/2014 |
| TW | 201545352 A | 12/2015 |

* cited by examiner

*Primary Examiner* — Hoai V Pham
(74) *Attorney, Agent, or Firm* — Muncy, Geissler, Olds & Lowe, P.C.

(57) ABSTRACT

A semiconductor structure includes a substrate and a buried gate structure in the substrate. The buried gate structure includes a gate dielectric layer, a first work function layer, a barrier layer, and a second work function layer. The gate dielectric layer is formed on the sidewalls and the bottom surface of a trench. The work function layer is formed in the trench and contacts the sidewalls and the bottom surface of the gate dielectric layer. The barrier layer is formed on the top surface of the first work function layer. The second work function layer is formed on the barrier layer, and the sidewall of the second work function layer is separated from the gate dielectric layer by a distance. The semiconductor structure further includes an insulating layer in the trench and on the second work function layer.

11 Claims, 7 Drawing Sheets

SEMICONDUCTOR STRUCTURE HAVING BURIED GATE STRUCTURE AND METHOD OF MANUFACTURING THE SAME

BACKGROUND

Field of the Disclosure

The present disclosure is related to a semiconductor structure and a method of manufacturing the same, and in particular, it is related to the semiconductor structure of a dynamic random access memory (DRAM) and a method of manufacturing the same.

Description of the Related Art

Dynamic Random Access Memory (DRAM) devices are widely used in consumer electronic products. In order to increase the integration of components in a dynamic random access memory device and improve its overall performance, the current methods of manufacturing dynamic random access memory devices continue to improve with respect to reducing the device size. However, as device sizes continue to shrink, many challenges arise. For example, how to improve gate induced drain leakage (GIDL) is one issue of concern. Although existing methods of manufacturing dynamic random access memory devices have generally been adequate for their intended purposes, they have not been entirely satisfactory in all respects. There are still some problems to be overcome in regards to the methods of manufacturing dynamic random access memory devices, such as the problems caused by reductions in device size.

SUMMARY

In some embodiments of the disclosure, a semiconductor structure is provided. The semiconductor structure includes a substrate and a buried gate structure in the substrate. In some embodiments, the buried gate structure includes a gate dielectric layer and a first work function layer in the trench. The gate dielectric layer is disposed on the sidewalls and the bottom surface of a trench in the substrate. The first work function layer contacts the sidewalls and the bottom surface of the gate dielectric layer. The buried gate structure further includes a barrier layer and a second work function layer. The barrier layer is disposed on the top surface of the first work function layer. The second work function layer is disposed on the barrier layer, and the sidewall of the second work function layer is separated from the gate dielectric layer by a distance. In addition, the semiconductor structure also includes an insulating layer in the trench, and the insulating layer is disposed on the second work function layer.

In some embodiments of the disclosure, a method of manufacturing a semiconductor structure is provided. In some embodiments, the method includes providing a substrate and forming a trench extending downward in the substrate. In some embodiments, the method also includes forming a gate dielectric layer on the sidewalls and the bottom surface of the trench, and forming a first work function layer on the lower portion of sidewalls and the bottom surface of the gate dielectric layer, wherein the first work function layer is disposed in the lower portion of the trench. In some embodiments, the method also includes forming a barrier material layer on the upper portion of the sidewalls of the gate dielectric layer and on the top surface of the first work function layer. In some embodiments, the method also includes forming a second work function material layer on the barrier material layer and recessing the second work function material layer to form a second work function layer on the barrier material layer. The second work function layer exposes a portion of the barrier material layer on the upper portion of the sidewalls of the gate dielectric layer. In some embodiments, the method further includes removing the exposed portion of the barrier material layer to form a barrier layer between the second work function layer and the first work function layer, wherein a space is formed between the sidewall of the second work function layer and the gate dielectric layer. In some embodiments, the method also includes forming an insulating layer in the trench, wherein the insulating layer is disposed on the second work function layer.

BRIEF DESCRIPTION OF THE DRAWINGS

The present disclosure can be further understood by reading the subsequent detailed description and examples with references made to the accompanying drawings, wherein.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various features may be arbitrarily drawn at different scales for the sake of simplicity and clarity. Some embodiments are described below. Throughout the various views and illustrative embodiments, similar reference numbers are used to designate similar features/components.

Figure 6:
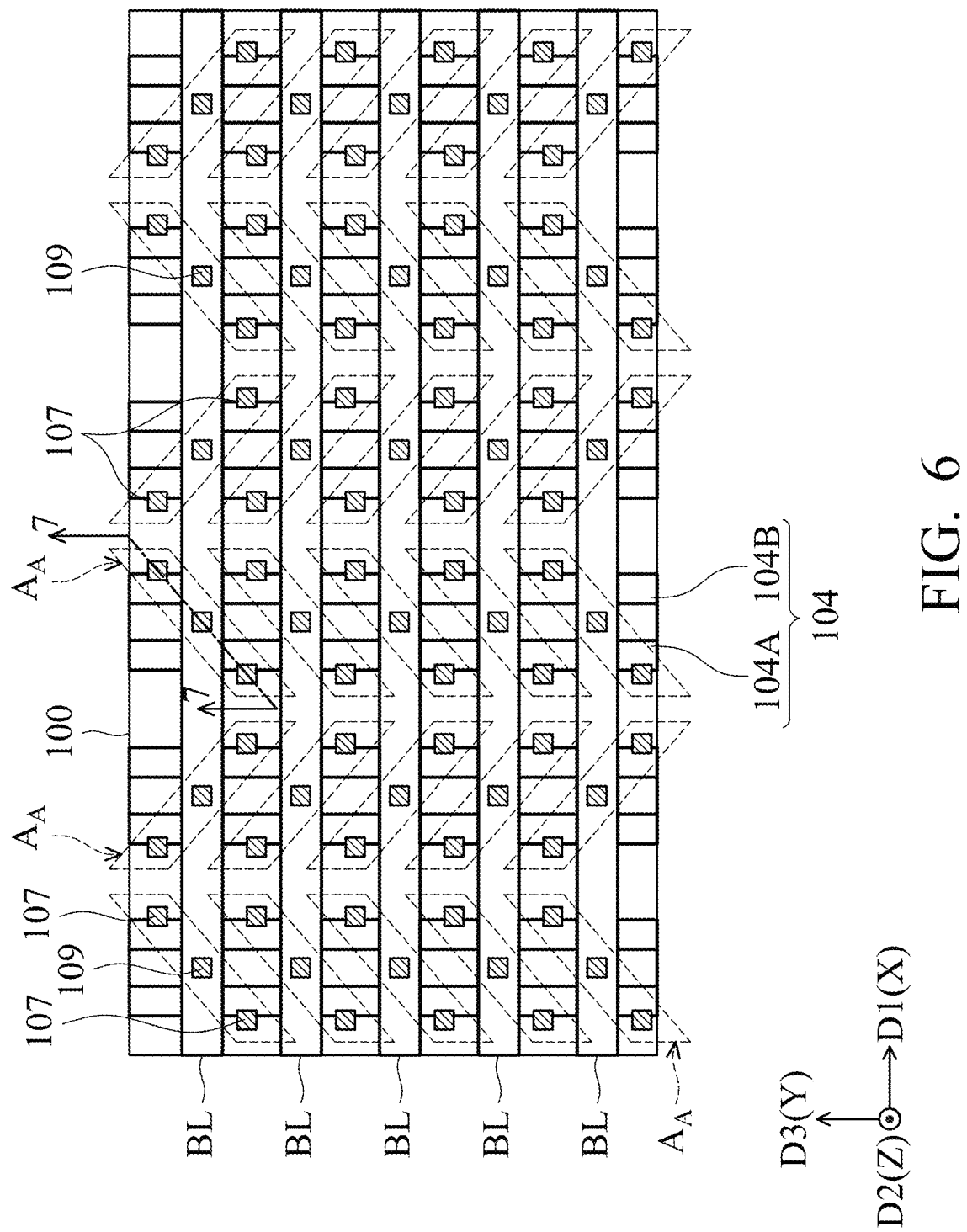
FIG. 6 is a top view of a memory device in accordance with one embodiment of the present invention.

FIG. 1A-FIG. 1F are cross-sectional views of various stages of manufacturing a semiconductor structure in accordance with an embodiment of the present invention. FIG. 6 is a top view of a memory device in accordance with an embodiment of the present invention, wherein FIG. 1A-FIG. 1F are cross-sectional views corresponding to sectional line 7-7 of the memory device in FIG. 6.

Referring again to FIG. 1A, a substrate 100 is provided, and the substrate 100 includes several trenches 103 extending downward from the top surface of the substrate 100. Also, a gate dielectric layer 112 is formed on the sidewalls 103s and the bottom surface 103b of each trench 103. The substrate 100 may include a semiconductor material. In some embodiments, the substrate 100 includes silicon, gallium arsenide, gallium nitride, germanium silicide, another suitable substrate material, or a combination thereof. In some other embodiments, the substrate 100 is a silicon-on-insulator (SOI) substrate.

In one embodiment, a mask material layer is formed on the substrate 100, and the mask material layer is then patterned to form a mask layer 111. The mask layer 111 may include silicon oxide or another suitable material. For example, the mask layer 111 includes tetraethyl orthosilicate (formally named tetraethoxysilane and abbreviated TEOS). Next, the mask layer 111 and the underlying substrate 100 are etched to form several shallow trenches by using the mask layer 111 as an etching mask, and the shallow trenches are filled with an isolation material to form the shallow trench isolation structures 102 (e.g. the regions outside the active regions $A_A$ in FIG. 6) surrounding the active regions $A_A$. Next, an etching process is performed on the mask layer 111 and the underlying substrate 100 to form the trenches 103 in the substrate 100. The trenches 103 are formed at the positions corresponding to word lines formed in the subsequent processes. The trenches 103 are separated from each other in the first direction D1 (as shown in FIG. 6). Also, each of the trenches 103 in the substrate 100 extends lengthwise in the third direction D3 and extends downward in the second direction D2 (as shown in FIG. 6).

Referring back to FIG. 1A, the gate dielectric layer 112 is formed on the sidewalls 103s and the bottom surface 103b of each trench 103. The gate dielectric layer 112 can be formed by a thermal oxidation process, a deposition process, another suitable process, or a combination thereof. In one embodiment, a thermal oxidation process is performed on the substrate 100 including silicon, thereby forming an silicon oxide layer as the gate dielectric layer 112 on the sidewalls 103s and the bottom surface 103b of the trench 103. In some other embodiments, the polysilicon layers are formed in the corresponding trenches 103 as polysilicon liners (and cover the sidewalls of the mask layers 111), and then a thermal oxidation process is performed to oxidize the polysilicon liners, thereby forming the gate dielectric layers 112.

In one embodiment, the gate dielectric layer 112 is a single layer structure or a multilayer structure. The gate dielectric layer 112 may include silicon oxide, silicon nitride, another suitable material, or a combination thereof. For example, the gate dielectric layer 112 may be an oxide-nitride-oxide (ONO) structure, or an oxide-nitride-oxide-nitride-oxide (ONONO) structure. To simplify the diagram, a single-layer gate dielectric layer 112 is depicted for clear illustrations. In one example, the gate dielectric layer 112 is a silicon oxide layer.

Figure 1A:
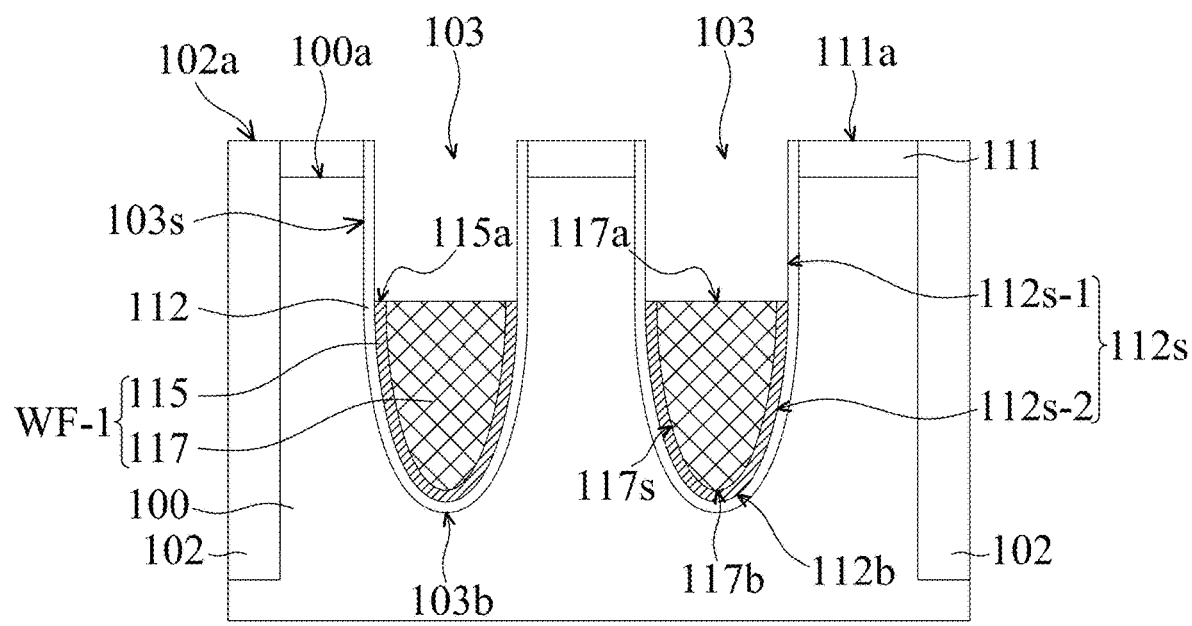
FIG. 1A-FIG. 1F are cross-sectional views of various stages of manufacturing a semiconductor structure in accordance with an embodiment of the present invention.

Next, the first work function layer WF-1 is formed in the lower portion of each trench 103. The first work function layer WF-1 may include a single material layer or several material layers. For example, the first work function layer WF-1 is a single metal layer, or a multilayer including a metal nitride layer and a metal layer. In this embodiment, the first work function layer WF-1 includes a barrier layer (such as the first barrier layer 115) and a conductive layer 117. However, the present disclosure is not limited to the material layers hereto. In some embodiments, a first barrier material layer (not shown) can be conformably deposited on the substrate 100 and the gate dielectric layers 102 in the corresponding trenches 103. Then, a conductive material layer (not shown) is formed over the substrate 100 and on the first barrier material layer. The conductive material layer also fills the trenches 103. Then, the excess portions of the first barrier material layer and the conductive material layer outside the trenches 103 are removed. The excess portions of the first barrier material layer and the conductive material layer can be removed by a chemical mechanical polishing (CMP) process, an etching back process or another suitable process. Next, the first barrier material layer and the conductive material layer in the trenches 103 are recessed, such as by a selective etching process. As shown in FIG. 1A, after recessing, the remaining portions of the first barrier material layer and the conductive material layer in the lower portions of the corresponding trenches 103 form the first barrier layers 115 and the conductive layers 117, respectively. Also, in this embodiment, the top surfaces 115a of the first barrier layers 115 are substantially level with the top surfaces 117a of the conductive layers 117.

As shown in FIG. 1A, the first barrier layers 115 and the conductive layers 117 are formed in the lower portions of the corresponding trenches 103. The first barrier layer 115 and the conductive layer 117 in each trench 103 form the first work function layer WF-1. Also, the first barrier layer 115 in each trench 103 contacts the gate dielectric layer 112 and is disposed between the gate dielectric layer 112 and the conductive layer 117. Specifically, the first barrier layer 115 is disposed between the lower portion 112s-2 of the sidewall 112s and the bottom surface 112b of the gate dielectric layer 112 and the sidewall 117s and the bottom surface 117b of the conductive layer 117.

In some embodiments, the material of the first barrier layer 115 includes one or more conductive metals. For example, the first barrier layer 115 includes metal, metal alloy, metal nitride, or metal silicide. In some embodiments, the first barrier layer 115 includes titanium nitride (TiN), titanium silicon nitride (TiSiN), tantalum nitride (TaN), tungsten nitride (WN), tantalum (Ta), titanium (Ti), tungsten (W), ruthenium (Ru), aluminum (Al), another suitable conductive material, or a combination thereof. In some embodiments, the first barrier layer 115 is formed by a deposition process, such as a physical vapor deposition (PVD) process, a chemical vapor deposition (CVD) process, or an atomic layer deposition (ALD) process.

In some embodiments, the material of the conductive layer 117 includes one or more conductive metals. For example, conductive layer 117 includes metal, metal alloy, metal nitride, or metal silicide. In some embodiments, the conductive layer 117 includes tungsten (W), tantalum (Ta), titanium (Ti), ruthenium (Ru), aluminum (Al), tungsten nitride (WN), titanium nitride (TiN), titanium silicon nitride (TiSiN), tantalum nitride (TaN), another suitable conductive material, or a combination thereof. In some embodiments, the conductive layer 117 is formed by a deposition process, such as a physical vapor deposition (PVD) process, a chemical vapor deposition (CVD) process, or an atomic layer deposition (ALD) process.

Figure 1B:
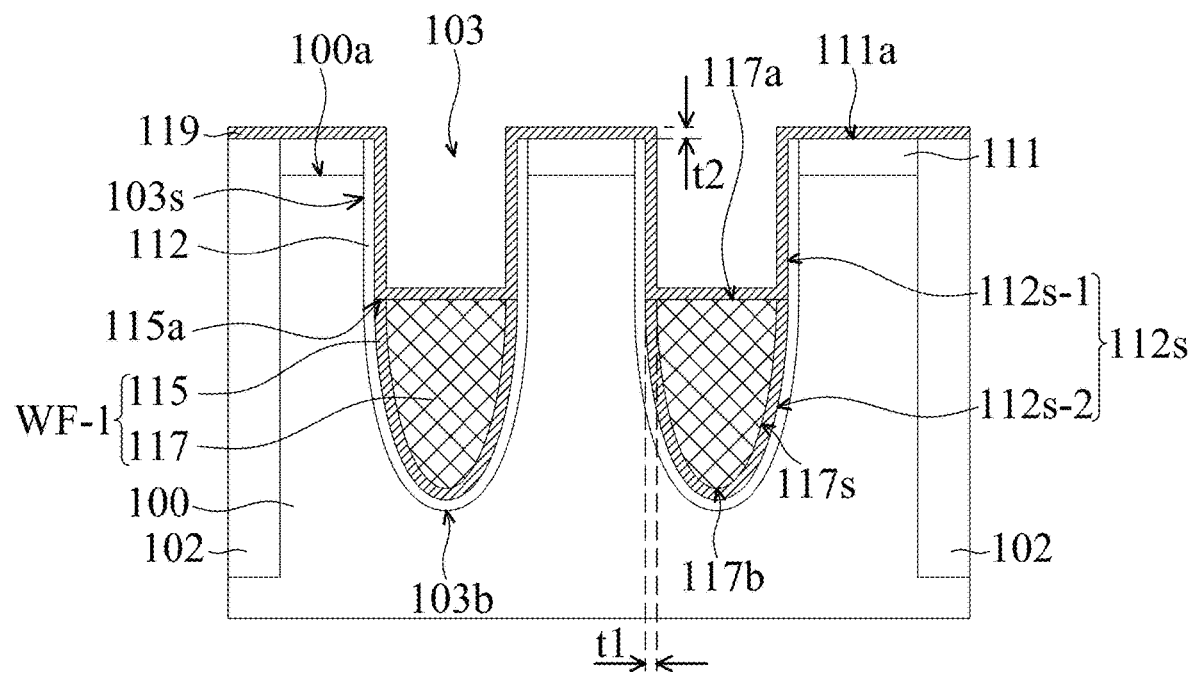

Next, as shown in FIG. 1B, a barrier material layer 119 is conformably formed on the substrate 100 and the upper portions of the trenches 103. In some embodiments, the barrier material layer 119 is formed on the upper portions 112s-1 of the sidewalls 112 of the gate dielectric layers 112, the top surfaces 115a of the first barrier layers 115 and the top surfaces 117a of the conductive layers 117. As shown in FIG. 1B, the barrier material layer 119 extends over the substrate 100. For example, the barrier material layer 119 is also formed on the top surface 111a of the mask layer 111.

In some embodiments, the first barrier layer 115 has a substantially uniform thickness, such as the thickness t1. The barrier material layer 119 has a substantially uniform thickness, such as the thickness t2. According to the method of the embodiment, the thickness t2 of the barrier material layer 119 determines the width (in the first direction D1) of the space formed subsequently, such as the space 125 in FIG. 1E and the space 125' in FIG. 2, thereby determining the distance between the subsequently formed buried gate structure and the gate dielectric layer 112 on the sidewall of the trench 103. The thicker the barrier material layer 119, the farther the distance between the second work function layer (such as the second work function layer 123 shown in subsequent FIG. 1E and FIG. 2) and the gate dielectric layer 112, and the smaller the intensity of the electric field in the substrate induced by the second work function layer 123. Therefore, the channel width in the substrate can be reduced, thereby preventing drain leakage current induced by the gate structure.

In one embodiment, the thickness t2 of the barrier material layer 119 is substantially equal to the thickness t1 of the first barrier layers 115, as shown in FIG. 1B. In some other embodiments, the thickness t2 is greater than the thickness t1. In one example, the thickness t1 of the first barrier layers 115 is in a range of 3.5 nm to 5.5 nm, such as in a range of 4 nm to 5 nm. The thickness t2 of the barrier material layer 119 is in a range of 4.5 nm to 7.5 nm, such as 5 nm to 7 nm.

In some embodiments, the barrier material layer 119 includes one or more conductive metals. For example, the barrier material layer 119 includes metal, metal alloy, metal nitride, or metal silicide. In some embodiments, the barrier material layer 119 includes titanium nitride (TiN), titanium silicon nitride (TiSiN), tantalum nitride (TaN), tungsten nitride (WN), tantalum (Ta), titanium (Ti), tungsten (W), ruthenium (Ru), aluminum (Al), another suitable conductive material, or a combination thereof. In some embodiments, the barrier material layer 119 is formed by a deposition process, such as a physical vapor deposition (PVD) process, a chemical vapor deposition (CVD) process, or an atomic layer deposition (ALD) process.

In some embodiments, the barrier material layer 119 and the first barrier layers 115 include the same conductive material. In some other embodiments, the barrier material layer 119 and the first barrier layers 115 include different conductive materials. Also, in some embodiments, the barrier material layer 119 and the conductive layer 117 include different materials. Also, the work function of the barrier material layer 119 is less than the work function of the conductive layer 117. In some embodiments, the first barrier layers 115 and the barrier material layer 119 include titanium nitride (TiN), and the conductive layer 117 includes tungsten (W).

Figure 1C:
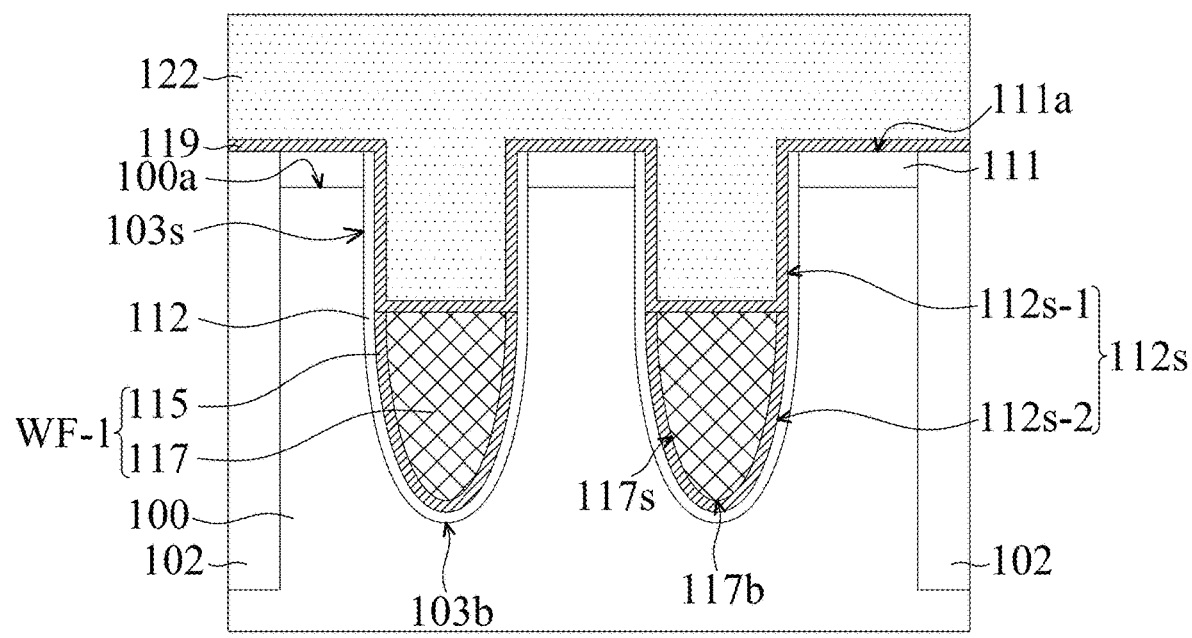

Next, as shown in FIG. 1C, a second work function material layer 122 is formed on the barrier material layer 119. The second work function material layer 122 may include one or more conductive materials. In some embodiments, the second work function material layer 122 fills the remaining spaces of the trenches 103 and is in direct contact with the barrier material layer 119. In this embodiment, the conductive layers 117 and the second work function material layer 122 are separated from each other by the barrier material layer 119. That is, the second work function material layer 122 does not contact the conductive layers 117.

In some embodiments, the second work function material layer 122 includes doped or undoped polysilicon, metal, metal alloy, metal nitride, or metal silicide. In some embodiments, the second work function material layer 122 includes polysilicon, titanium nitride (TiN), titanium silicon nitride (TiSiN), tantalum nitride (TaN), tungsten nitride (WN), tantalum (Ta), titanium (Ti), tungsten (W), ruthenium (Ru), aluminum (Al), another suitable conductive material, or a combination thereof. In some embodiments, the second work function material layer 122 can be formed by a deposition process, such as a physical vapor deposition (PVD) process, a chemical vapor deposition (CVD) process, or an atomic layer deposition (ALD) process.

In some embodiments, the material of the second work function material layer 122 is different from the materials of the first barrier layers 115, the conductive layers 117 and the barrier material layer 119. In some embodiments, the work function of the second work function material layer 122 is less than the work function of the conductive layer 117.

Figure 1D:
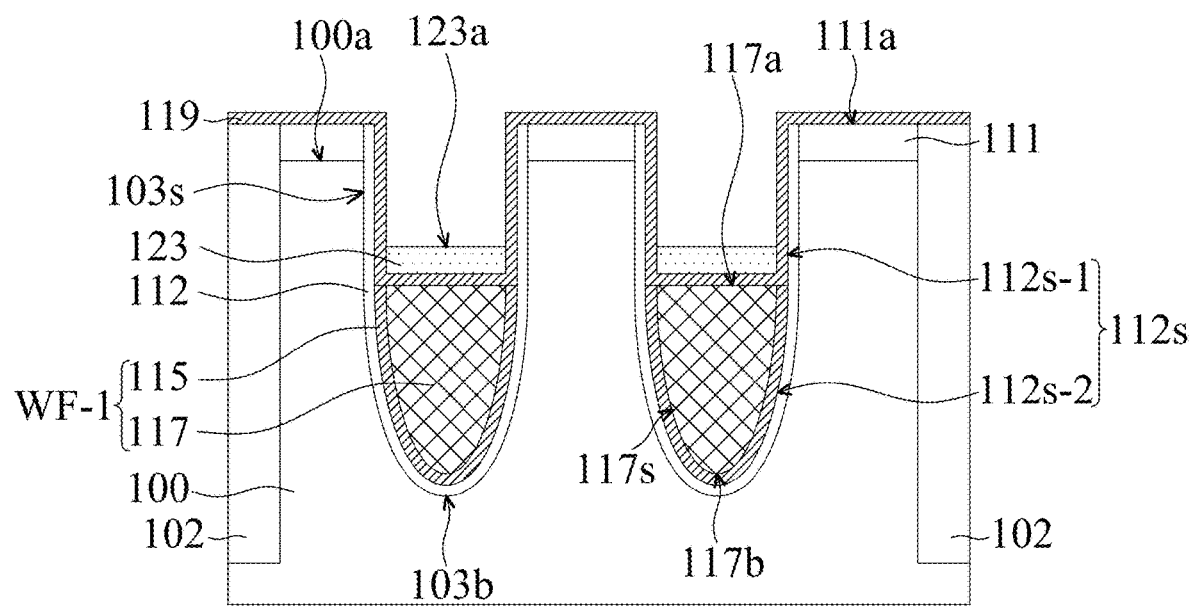

Next, as shown in FIG. 1D, the portion of the second work function material layer 122 above the substrate 100 is removed, and the remaining portion of the second work function material layer 122 in each trench 103 is recessed to form a second work function layer 123. In one embodiment, the second work function layer 123 in each trench 103 is formed above the top surface 117a of the conductive layers 117, and the second work function layer 123 is separated from the conductive layers 117 by a portion of the barrier material layer 119. In some embodiments, the portion of the second work function material layer 122 above the substrate 100 can be removed by a chemical mechanical polishing (CMP) process, an etching back process, a selective etching process, another suitable process or a combination thereof. Also, the remaining portion of the second work function material layer 122 in each trench 103 can be recessed by a selective etching process or another suitable process to form the second work function layer 123. In some embodiments, the top surfaces 123a of the second work function layers 123 are not higher than the bottom surfaces of the doping regions (e.g. functioning as source/drain regions) in the active regions (not shown), thereby increasing the distance between the bottom surfaces of the doping regions and the buried gate structure. The increasing distance between the doping regions and the buried gate structure reduces current leakage, thereby improving the electrical properties of the semiconductor structure.

Figure 1E:
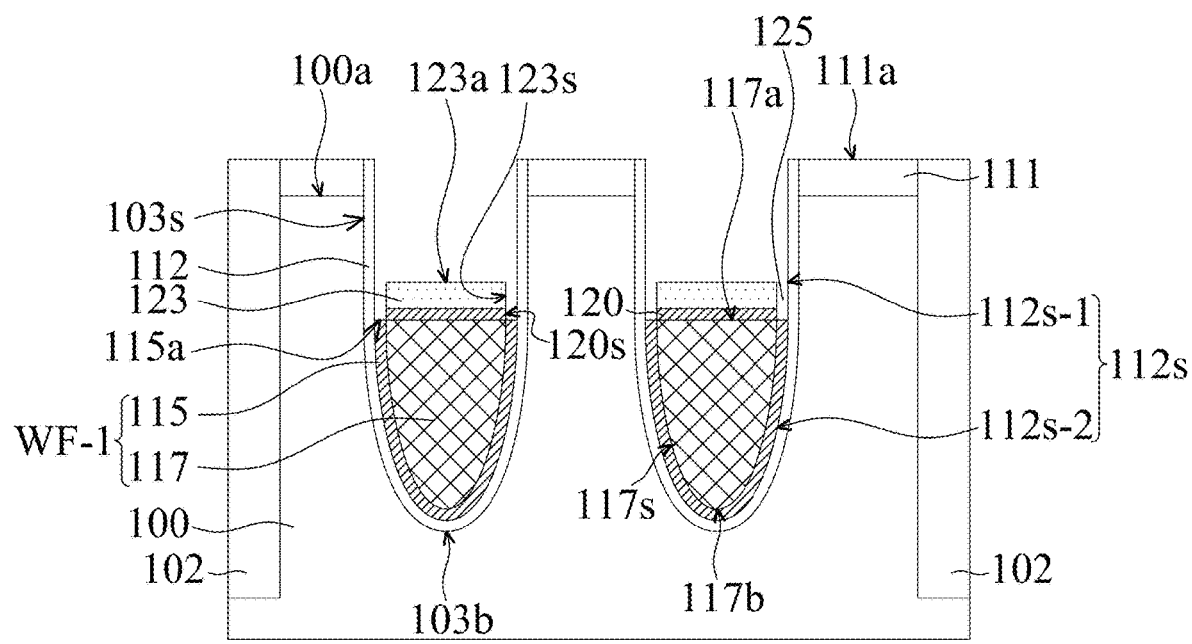

Next, as shown in FIG. 1E, in one embodiment, a portion of the barrier material layer 119 is removed, and the remaining portion of the barrier material layer 119 forms a second barrier layer 120. In each trench 103, the second barrier layer 120 can be disposed between the second work function layer 123 and the conductive layer 117. Also, in some embodiments, after the portion of the barrier material layer 119 is removed, a space 125 is formed between the sidewall 123s of the second work function layer 123 and the gate dielectric layer 112.

In addition, in one embodiment, besides removing the exposed portion of the barrier material layer 119, at least a portion of the barrier material layer 119 between the sidewall 123s of the second work function layer 123 and the gate dielectric layers 112 is further removed, thereby forming the space 125. In some embodiments, the portion of the barrier material layer 119 is removed by a selective etching process. For example, an etchant or an etching gas that is selective to the material of the second work function layer 123 may be used to perform wet etching or dry etching on the barrier material layer 119.

It should be noted that the width of the space 125 (in the first direction D1 shown in FIG. 6) is determined by the thickness t2 of the barrier material layer 119. Accordingly, the distance between the second work function layer 123 and the substrate 100 can be controlled by controlling the thickness t2 of the barrier material layer 119. Thus, the electric field between the second work function layer 123 and the doping regions (e.g. functioning as source/drain regions) can be controlled, thereby suppressing the generation of gate induced drain leakage (GIDL) path.

Figure 2:
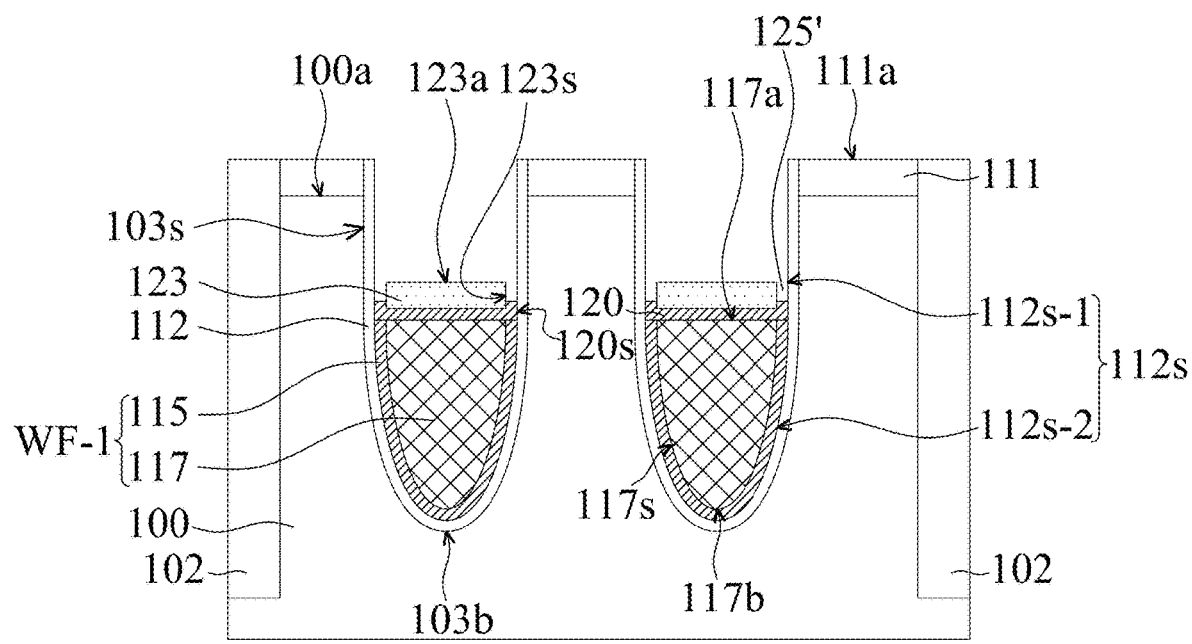
FIG. 2 is a cross-sectional view of an intermediate stage of manufacturing a semiconductor structure in accordance with another embodiment of the present invention, which shows an alternative embodiment of the structure in FIG. 1E.

In addition, the depth of the space 125 can be appropriately controlled and adjusted according to actual requirements of the application. For example, in this embodiment, the space 125 in each trench 103 exposes the entire sidewall 123s of the second work function layer 123 (as shown in FIG. 1E). Specifically, the portion uncovered by the second work function layer 123 is completely removed. Therefore, the space 125 in each trench 103 exposes a portion of the gate dielectric layer 112, the entire sidewall 123s of the second work function layer 123 and the top surface 115a of the first barrier layer 115. In some other embodiments, the space 125 may merely expose parts of the sidewall 123s of the second work function layer 123 (as shown in FIG. 2). In some other embodiments, the space 125 may further extend downward to expose parts of the sidewall 117s of the conductive layer 117.

As shown in FIG. 1E, after the removal of the portion of the barrier material layer 119 is performed, the sidewall 123s of the second work function layer 123 is substantially aligned with the sidewall 120s of the second barrier layer 120. In addition, in one embodiment, after the removal of the portion of the barrier material layer 119 is performed, the conductive layer 117 is surrounded by the first barrier layer 115 and the second barrier layer 120.

FIG. 2 is a cross-sectional view of an intermediate stage of manufacturing a semiconductor structure in accordance with another embodiment of the present invention. The structure of FIG. 2 is shown as an alternative embodiment of the structure in FIG. 1E. Compared to the semiconductor structure in FIG. 1E, the semiconductor structure in FIG. 2 shows that a portion of the barrier material layer 119 adjacent to the sidewall 123s of the second work function layer 123 is removed. Therefore, the space 125' in FIG. 2 merely exposes parts of the sidewall 123s of the second work function layer 123.

Figure 1F:
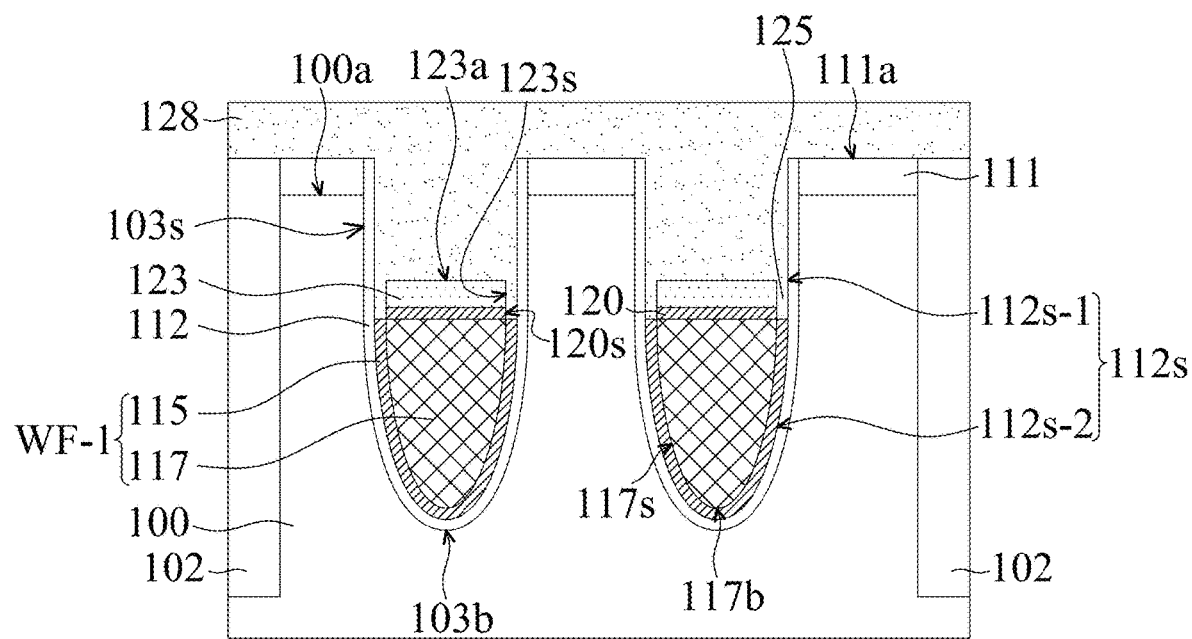
Figure 3:
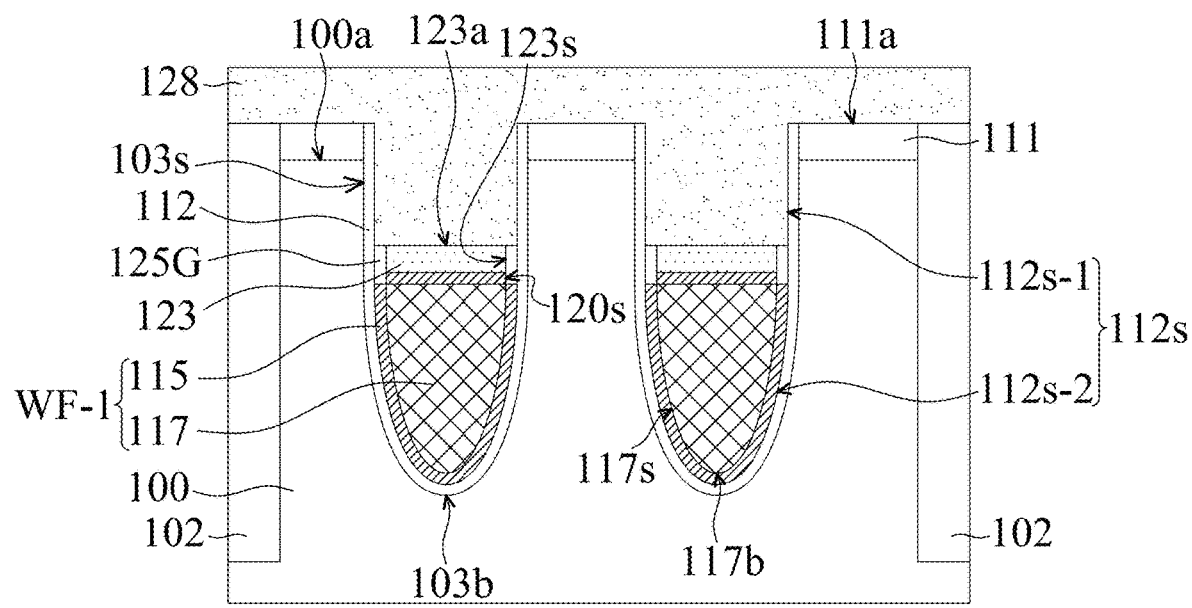
FIG. 3 is a cross-sectional view of an intermediate stage of manufacturing a semiconductor structure in accordance with another embodiment of the present invention, which shows an alternative embodiment of the structure in FIG. 1F.
Figure 4:
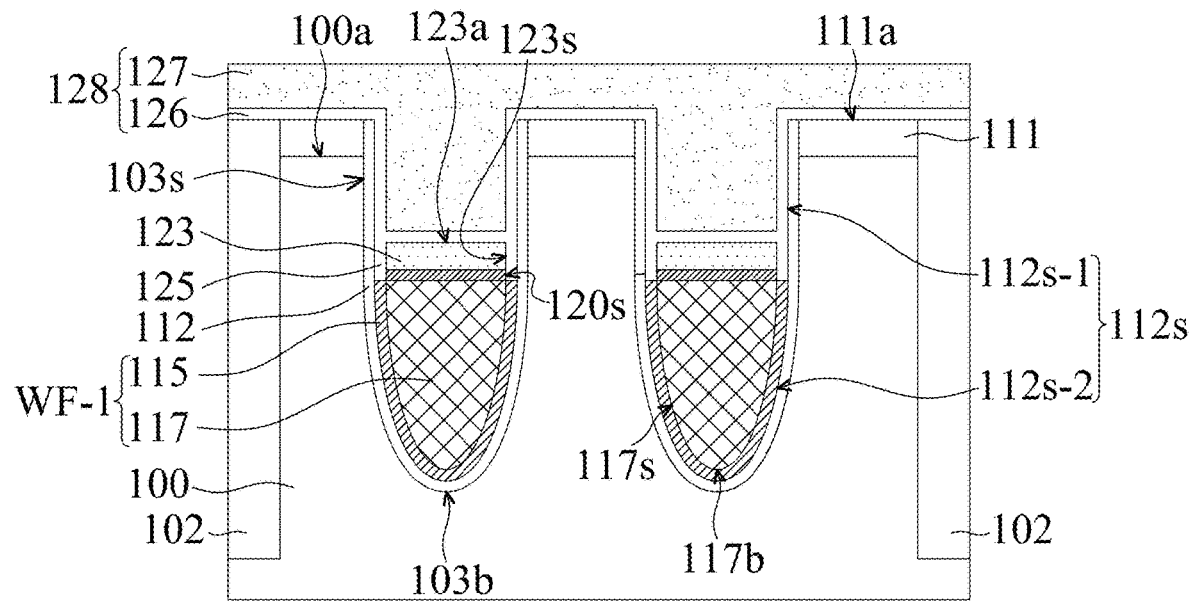
FIG. 4 is a cross-sectional view of an intermediate stage of manufacturing a semiconductor structure in accordance with some other embodiments of the present invention, which shows an alternative embodiment of the structure in FIG. 1F.

Next, as shown in FIG. 1F, after forming the spaces 125 (FIG. 1E), an insulating layer 128 is formed in the trenches 103 and disposed on the second work function layers 123. The insulating layer 128 covers the second work function layers 123, the second barrier layer 120 and the first barrier layer 115. In this embodiment, the insulating layer 128 in each trench 103 also fills the space 125 between the sidewall 123s of the second work function layer 123 and the gate dielectric layer 112. In some other embodiments, the insulating layer 128 may partially fill the spaces 125 or leave the spaces 125 intact (as shown in FIG. 3). In addition, in some embodiments, the trenches 103 can be filled with multiple layers of insulating materials. That is, the insulating layer 128 may include several insulating material layers 128 (as shown in FIG. 4).

The material of the insulating layer 128 includes, for example, nitride, oxide, another suitable dielectric material, or a combination thereof. In some embodiments, the insulating layer 128 includes silicon nitride, silicon oxide, another suitable material, or a combination thereof. The insulating layer 128 can be a single layer or multiple layers of insulating material. In some embodiments, the insulating layer 128 and the gate dielectric layers 112 may include different insulating materials. Also, the insulating layer 128 can be formed by a physical vapor deposition (PVD) process, a chemical vapor deposition (CVD) process, an atomic layer deposition (ALD) process, a spin-coating process, another suitable process, or a combination thereof.

FIG. 3 is a cross-sectional view of an intermediate stage of manufacturing a semiconductor structure in accordance with another embodiment of the present invention. FIG. 4 is a cross-sectional view of an intermediate stage of manufacturing a semiconductor structure in accordance with some other embodiments of the present invention. The structures of FIG. 3 and FIG. 4 are shown as alternative embodiments of the structure in FIG. 1F.

Referring to FIG. 3, in this embodiment, the spaces 125 is partially filled or not filled with the insulating layer 128 after the insulating layer 128 is deposited. Therefore, an air gap 125G is formed between the sidewall 123s of the second work function layer 123 and the gate dielectric layer 112. The insulating layer 128 is formed on the top surface 123a of the second work function layer 123 and above the air gap 125G. Compared to the embodiment as shown in FIG. 1F (i.e. the space 125 fully filled with the insulating layer 128), the air gap 125G in this embodiment can further reduce the leakage current since the dielectric constant of air (in the air gap 125G) is greater than the dielectric constant of the insulating layer 128 (in the space 125).

Referring to FIG. 4, the insulating layer 128 includes two insulating portions 126 and 127. Specifically, after the step as shown in FIG. 1E is performed, the insulating portion 126 is formed on the substrate 100 and conformably deposited in the trenches 103. Then, the insulating portion 127 is blanketly formed on the substrate 100 and fills the trenches 103. As shown in FIG. 4, the insulating portion 126 is formed in the trenches 103 and on the second work function layer 123. Also, the insulating portion 126 fills the space 125 between the sidewall 123s of the second work function layer 123 and the gate dielectric layer 112 in each trench 103. In this embodiment, the insulating portion 126 further covers the top surface 123a and the sidewall 123s of the second work function layer 123. In some embodiments, the insulating portions 126 and 127 include different materials. For example, the insulating portion 126 is an oxide layer, and the insulating portion 127 is a nitride layer. In some other embodiments, the insulating portion 126 and the gate dielectric layer 112 may include the same insulating material. For example, the insulating portions 126 and 127 include silicon oxide. In this embodiment, the insulating layer 128 has a multi-layer structure, and an overall dielectric constant of the insulating layer 128 can be increased by selecting different insulating materials with different dielectric constants. Therefore, compared to the embodiment as shown in FIG. 1F (i.e. the insulating layer 128 with a single-layer structure filling the trench 103), the insulating layer 128 with a multi-layer structure as shown in FIG. 4 can further reduce the leakage current.

Figure 5:
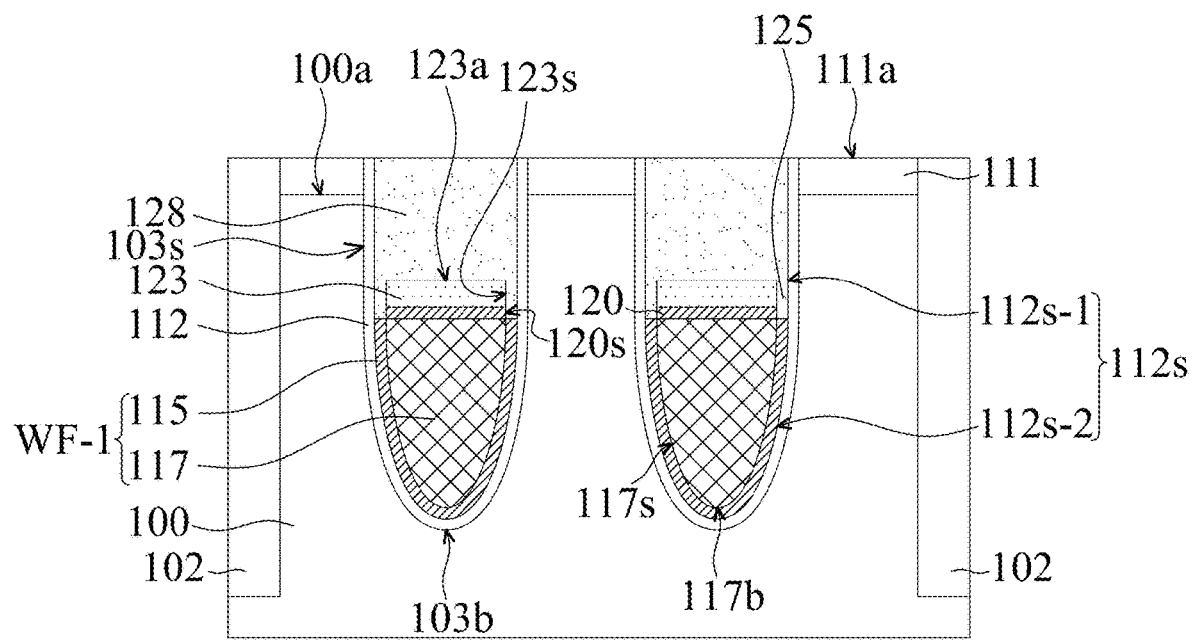
FIG. 5 is a cross-sectional view of an intermediate stage of manufacturing a semiconductor structure in accordance with one embodiment of the present invention, which shows a process following the step of FIG. 1F.

FIG. 5 is a cross-sectional view of an intermediate stage of manufacturing a semiconductor structure in accordance with one embodiment of the present invention, which shows a process following the step of FIG. 1F. After the insulating layer 128 is formed in the trenches 103 and disposed on the second work function layers 123 (as shown in FIG. 1F), a planarization process may be performed to remove a portion of the insulating layer 128 until the top surface 111a of the mask layer 111 is exposed. As shown in FIG. 5, the components underlying the remaining portion of the insulating layer 128, including the first work function layer WF-1, the second work function layer 123 and the second barrier layer 120, form a buried gate electrode in each trench 103. In some embodiments, the first work function layer WF-1 includes the first barrier layer 115 and the conductive layer 117. In some other embodiments, the first work function layer WF-1 includes the conductive layer 117 only.

Figure 7:
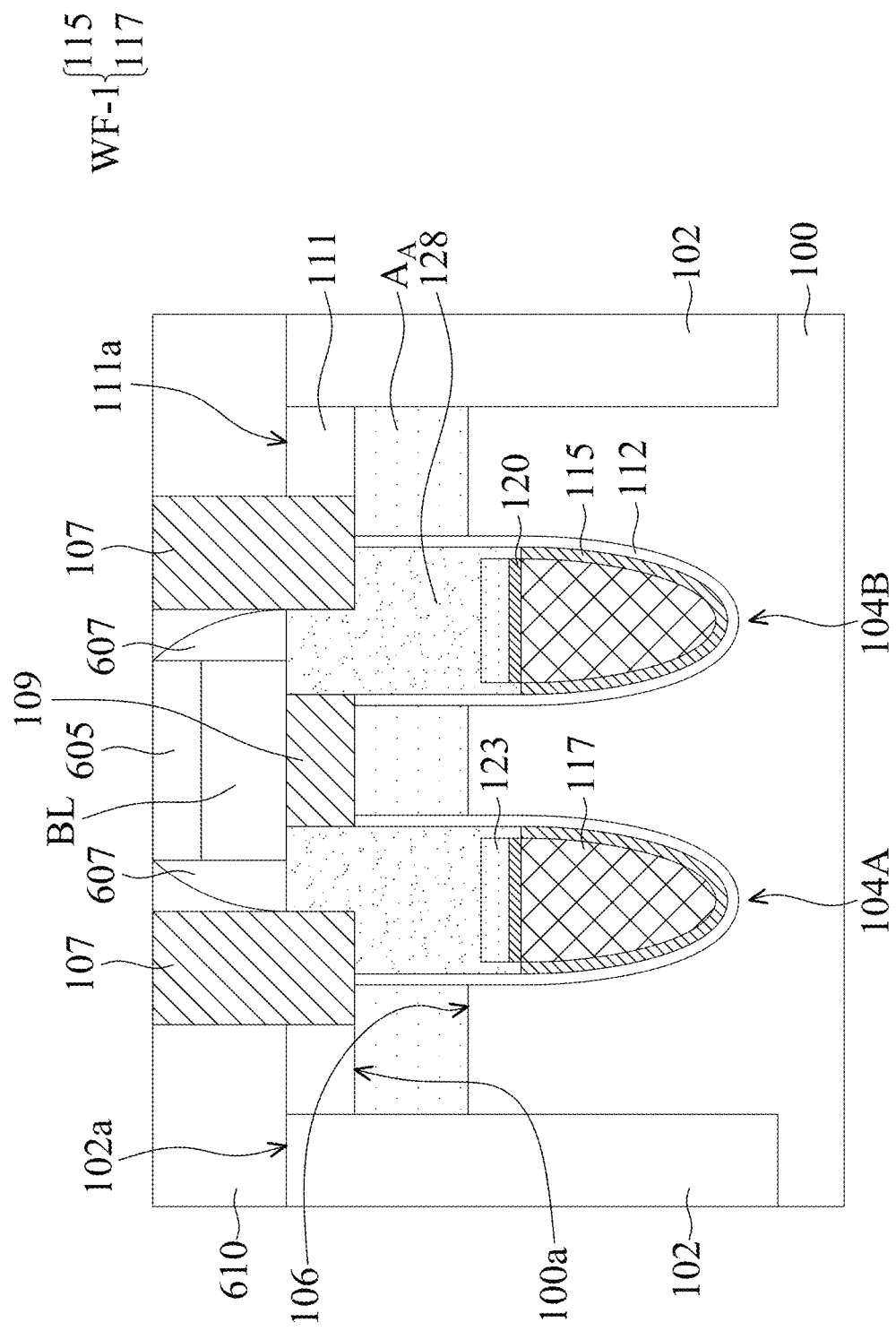
FIG. 7 is a cross-sectional view taken along sectional line 7-7 of the semiconductor structure in FIG. 6.

The buried gate structures of the embodiments can be applied to a dynamic random access memory (DRAM) device as buried word lines. An exemplary embodiment is provided below for illustrating a method of fabricating a DRAM device after forming the buried gate structures in accordance with some embodiments of the present invention. Referring to FIG. 6 and FIG. 7. FIG. 6 is a top view of a memory device in accordance with one embodiment of the present invention. FIG. 7 is a cross-sectional view taken along sectional line 7-7 of the semiconductor structure in FIG. 6. The features/components in FIG. 6 and FIG. 7 similar or identical to the features/components in FIG. 1A-FIG. 1F and FIG. 2-FIG. 5 are designated with similar or the same reference numbers, and the description of those similar or the identical features/components are not repeated herein. In addition, the buried gate structure as shown in FIG. 7 is identical to the buried gate structure in FIG. 5. However, the present disclosure is not limited thereto.

Referring to FIG. 6, the memory device includes the substrate 100, several active regions $A_A$, several shallow trench isolation (STI) structures (such as STI structures 102 shown in FIG. 1A-FIG. 1E), several bit lines BL, several sets of word lines 104, several capacitive contact plugs 107 and the bit line contact plugs 109. Several doping regions are formed in the substrate 100 to serve as the active regions $A_A$. The active regions $A_A$ are arranged substantially in the first direction D1 (such as X-direction in FIG. 6) and tilted at an angle with respect to the first direction D1. Also, the substrate 100 further includes shallow trench isolation structures 102 (shown in FIG. 1A-FIG. 1E, but not shown in FIG. 6) surrounding the active regions $A_A$. In this embodiment, the active regions $A_A$ are alternately formed in the first direction D1 (such as X-direction) and arranged in a wave-like shape (or in a zigzag shape). However, the present disclosure is not limited thereto.

The bit lines BL are formed above the substrate 100 and extend in the first direction D1 (such as X-direction). Adjacent bit lines BL are separated from each other in the third direction D3 (such as Y-direction in FIG. 6). Several sets of word lines 104 are formed in the substrate 100 and the word lines extend in the third direction D3 (such as Y-direction). In one embodiment, each set of word lines 104 includes two buried word lines 104A and 104B. Adjacent buried word lines 104A and 104B are arranged and separated from each other in the first direction D1 (such as X-direction). The structures of the buried word lines 104A and 104B in FIG. 7 are identical to the structures of the buried gate structures in FIG. 5, and the details are not repeated herein.

As shown in FIG. 6, the active regions $A_A$ extend across the respective sets of word lines 104, wherein each set of word lines 104 includes the buried word lines 104A and 104B. Also, each active region $A_A$ and the corresponding bit line BL across the active region $A_A$ have an overlapping area (such as the middle section of the active region $A_A$) and non-overlapping areas at two opposite sides of the overlapping area. There is a capacitive contact plug 107 in each of the non-overlapping areas of the active region $A_A$ and the bit line BL, and the capacitive contact plug 107 is electrically connected to a capacitor (not shown in FIG. 7) that is disposed above the capacitive contact plug 107. Also, each of the capacitive contact plugs 107 is positioned between two adjacent bit lines BL. In one embodiment, the capacitive contact plugs 107 are formed on the substrate 100 and contact parts of the top surfaces of the respective doping regions in the substrate 100. For example, as shown in FIG. 6 and FIG. 7, in each active region $A_A$, two capacitive contact plugs 107 are positioned at two opposite sides of the respective set of word lines 104 and electrically connect parts of the doping region (i.e. the active region $A_A$) at two opposite sides of the respective set of word lines 104. Therefore, the doping regions in contact with the capacitive contact plugs 107 function as source/drain regions in the memory device.

As shown in FIG. 6 and FIG. 7, there is a bit line contact plug 109 in the overlapping area of each active region $A_A$ and the respective bit line BL. In one embodiment, the bit line contact plug 109 is formed between the insulating layers 128 of two adjacent buried word lines 104A and 104B. Also, the bottom surfaces of the bit line contact plugs 109 contact the doping regions of the substrate 100. One applicable method for forming a bit line contact plug 109 is provided below. First, a trench-shaped aperture is formed between the insulating layers 128 of two adjacent buried word lines 104A and 104B, and the trench-shaped aperture exposes part of the doping region of the substrate 100. Next, a polysilicon layer is formed on the substrate 100 and fills the trench-shaped aperture. Then, one or more conductive materials and an insulating material such as silicon nitride are deposited subsequently above the polysilicon layer. Examples of the aforementioned one or more conductive materials include titanium (Ti), tungsten (W), tantalum (Ta), titanium nitride (TiN), tantalum nitride (TaN) and tungsten nitride (WN). Next, a photolithography process is performed. For example, the polysilicon layer, the conductive layer including one or more conductive materials and the insulating layer (such as silicon nitride) are patterned using a photoresist as a mask to form a stacked structure including the bit line contact plug 109, the bit line BL and the cap insulating film 605. In this exemplified embodiment, the polysilicon filling in the aforementioned trench-shaped aperture functions as the bit line contact plug 109. The bit line BL on the bit line contact plug 109 may include one or more conductive materials such as titanium (Ti), tungsten (W), tantalum (Ta), titanium nitride (TiN), tantalum nitride (TaN) and tungsten nitride (WN), and the bit line BL extends in the first direction D1.

As shown in FIG. 6 and FIG. 7, each bit line BL extends across the respective set of word lines 104, and the bit line BL is electrically connected to the buried word lines 104A and 104B via the bit line contact plug 109. For example, the bottom surface of the bit line contact plug 109 contacts the top surface of the doping region that is formed between the buried word lines 104A and 104B.

In addition, as shown in FIG. 7, the sidewall films 607 can be provided to cover the side surfaces of the bit lines BL and the side surfaces of the cap insulating films 605. Each sidewall film 37 has a function of protecting the sidewall of the bit line BL. The sidewall films 607 may include one or more materials, for example, silicon oxide, and silicon nitride. Alternatively, the positions of the sidewall films 607 in FIG. 7 can be replaced by air gaps. After the aforementioned photolithography process is performed, a liner (such as a silicon nitride layer) is conformably deposited on the substrate 100 and then patterned by dry etching, thereby forming the sidewall films 607 to cover the side surfaces of the bit lines BL and the side surfaces of the cap insulating films 605. Then, after an insulating material layer (such as a silicon oxide layer) is formed on the entire substrate, a planarization process is performed using the cap insulating film 605 as a stop layer, thereby forming an interlayer insulating film 610 on opposite sides of the bit lines BL. Next, the interlayer insulating film 610 and the mask layer 111 are anisotropically etched (specifically, dry etched) to form contact holes (not shown) that expose parts of the top surfaces of the doping regions in the substrate 100. Next, one or more conductive materials including polysilicon, titanium nitride and tungsten are deposited on the interlayer insulating film 610 and fill the contact holes. The excess conductive material above the interlayer insulating film 610 is removed by, for example, chemical mechanical polishing (CMP), to form the capacitive contact plugs 107. In one embodiment, the capacitive contact plugs 107, the bit line contact plugs 109, the bit lines BL and the cap insulating films 605 are formed in the interlayer insulating film 610. Also, the top surfaces of the capacitive contact plugs 107 and the top surfaces of the cap insulating films 605 may be level with the top surface of the interlayer insulating film 610.

According to the aforementioned descriptions, the semiconductor structure and the method of manufacturing the same, in accordance with some embodiments, includes the second work function layer 123 having different work function than the first work function layer 117, wherein the work function of the second work function layer 123 is less than the work function of the first work function layer 117. Accordingly, the electric field in the substrate induced by the second work function layer 123 can be reduced, and the channel width of the gate electrode can be adjusted to suppress the gate induced drain leakage (GIDL).

In addition, the distance between the second work function layer 123 and the substrate 100 can be controlled by adjusting the width of the space 125/125' (i.e. the thickness t2 of the barrier material layer 119). Accordingly, the electric field in the substrate that is induced by the second work function layer 123 can be reduced, so that the gate induced drain leakage (GIDL) can be decreased. Besides formation of the spaces 125 or 125', the semiconductor structure in the embodiments may include dielectrics with different structures above the second work function layer 123 and between the second work function layer 123 and the substrate 100 to suppress the gate induced drain leakage (GIDL). For example, a dielectric layer having a single layer structure (such as the insulating layer 128 shown in FIG. 1E) or having a multilayer structure (such as the air gap 125G and the insulating layer 128 shown in FIG. 3, or insulating layer 128 including the insulating portions 126 and 127 shown in FIG. 4) can be formed to suppress the gate induced drain leakage (GIDL).

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a substrate;
   a buried gate structure in the substrate, the buried gate structure comprising:
   a gate dielectric layer on sidewalls and a bottom surface of a trench in the substrate;
   a first work function layer in the trench, wherein the first work function layer contacts sidewalls and a bottom surface of the gate dielectric layer;
   a barrier layer, on a top surface of the first work function layer; and
   a second work function layer on the barrier layer, wherein a sidewall of the second work function layer is separated from the gate dielectric layer by a distance; and
   an insulating layer in the trench and on the second work function layer, wherein the insulating layer fills a space between the sidewall of the second work function layer and the gate dielectric layer.

2. The semiconductor structure as claimed in claim 1, wherein the insulating layer comprises:
   a first insulating portion in the trench and on the second work function layer, wherein the first insulating portion fills a space between the sidewall of the second work function layer and the gate dielectric layer; and
   a second insulating portion in the trench and on the first insulating portion.

3. The semiconductor structure as claimed in claim 2, wherein the first insulating portion covers a top surface and the sidewall of the second work function layer, and the second insulating portion is separated from the second work function layer by the first insulating portion.

4. The semiconductor structure as claimed in claim 2, wherein the first insulating portion and the gate dielectric layer are made of a same material, and the first insulating portion and the second insulating portion include different materials.

5. The semiconductor structure as claimed in claim 1, wherein the first work function layer comprises:
   a first barrier layer in the trench, wherein the first barrier layer is formed on the sidewalls and the bottom surface of the gate dielectric layer; and
   a conductive layer in the trench, wherein the first barrier layer surrounds a sidewall and a bottom surface of the conductive layer,
   wherein the barrier layer on the top surface of the first work function layer forms a second barrier layer.

6. The semiconductor structure as claimed in claim 5, wherein a work function of the second barrier layer is less than a work function of the conductive layer, and is greater than a work function of the second work function layer.

7. A method of manufacturing a semiconductor structure, comprising:
   providing a substrate, and forming a trench extending downward in the substrate;
   forming a gate dielectric layer on sidewalls and a bottom surface of the trench;
   forming a first work function layer on a lower portion of sidewalls and a bottom surface of the gate dielectric layer, wherein the first work function layer is disposed in a lower portion of the trench;
   forming a barrier material layer on an upper portion of the sidewalls of the gate dielectric layer and on a top surface of the first work function layer;
   forming a second work function material layer on the barrier material layer;
   recessing the second work function material layer to form a second work function layer on the barrier material layer, and exposing a portion of the barrier material layer on the upper portion of the sidewalls of the gate dielectric layer;
   removing the exposed portion of the barrier material layer to form a barrier layer between the second work function layer and the first work function layer, wherein a space is formed between a sidewall of the second work function layer and the gate dielectric layer; and forming an insulating layer in the trench and on the second work function layer, wherein the insulating layer fills the space between the sidewall of the second work function layer and the gate dielectric layer.

8. The method of manufacturing the semiconductor structure as claimed in claim 7, wherein the second work function material layer directly contacts the portion of the barrier material layer on the upper portion of the sidewalls of the gate dielectric layer when the second work function material layer is formed on the barrier material layer.

9. The method of manufacturing the semiconductor structure as claimed in claim 7, wherein the insulating layer comprises:
 a first insulating portion in the trench and on the second work function layer, wherein the first insulating portion fills the space between the sidewall of the second work function layer and the gate dielectric layer, and the first insulating portion covers the top surface and the sidewall of the second work function layer; and
 a second insulating portion in the trench and on the first insulating portion, wherein the second insulating portion is separated from the second work function layer by the first insulating portion.

10. The method of manufacturing the semiconductor structure as claimed in claim 7, wherein forming the first work function layer comprises:
 forming a first barrier layer on the lower portion of the sidewalls and the bottom surface of the gate dielectric layer, and forming a conductive layer in the lower portion of the trench, wherein the first barrier layer surrounds sidewalls and a bottom surface of the conductive layer, wherein the first barrier layer and the conductive layer form the first work function layer,
 wherein the barrier material layer is formed on the upper portion of the sidewalls of the gate dielectric layer, on a top surface of the first barrier layer and on top surface of the conductive layer,
 wherein after removing the exposed portion of the barrier material layer, a remaining portion of the barrier layer forms a second barrier layer.

11. The method of manufacturing the semiconductor structure as claimed in claim 10, wherein a work function of the barrier material layer is less than a work function of the conductive layer, and is greater than a work function of the second work function material layer.

\* \* \* \* \*